(12) United States Patent
Forstner

(10) Patent No.: US 6,255,910 B1
(45) Date of Patent: Jul. 3, 2001

(54) ACTIVE OPERATING POINT ADJUSTMENT FOR POWER AMPLIFIERS

(75) Inventor: Johann-Peter Forstner, Steinhoering (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/510,642

(22) Filed: Feb. 22, 2000

Related U.S. Application Data

(63) Continuation of application No. PCT/DE99/01679, filed on Jun. 8, 1999.

(30) Foreign Application Priority Data

Jun. 22, 1998 (DE) .............................................. 198 27 702

(51) Int. Cl.[7] .................................................. H03F 3/04
(52) U.S. Cl. ......................... 330/289; 330/296; 330/307
(58) Field of Search .................................... 330/277, 289, 330/296, 300, 307

(56) References Cited

U.S. PATENT DOCUMENTS

| 5,216,383 | * | 6/1993 | Uittenbogaard et al. | ........ 330/277 X |
| 5,952,886 | * | 9/1999 | Buer et al. | ........ 330/307 X |
| 6,046,642 | * | 4/2000 | Brayton et al. | ........ 330/296 |

FOREIGN PATENT DOCUMENTS

| 0 529 421 A2 | 3/1993 | (EP) . |
| 0 529 421 B1 | 3/1993 | (EP) . |
| 2 307 155 | 11/1996 | (GB) . |

OTHER PUBLICATIONS

Non–Patent Document "Rahmen–/Takt–und Frequenzsynchronisation . . . ", chapter 5, pp. 53–71, pertains to the frame–/cycle–and frequencesynchronization for a OFDM system.

Non–Patent Document "Low–Overhead, Low–Complexity [Burst] Synchronization for OFDM" ((Schmidl et al.), dated Jun. 23, 1996, XP 000625022, pp. 1301–1306.

Non–Patent Document "Burst Synchronization for OFDM–based cellular systems . . . " (Stantchev et al.), dated 1998, XP–002089525 pp. 758–762.

* cited by examiner

*Primary Examiner*—Steven J. Mottola
(74) *Attorney, Agent, or Firm*—Herbert L. Lerner; Laurence A. Greenberg; Werner H. Stemer

(57) ABSTRACT

An amplifier circuit containing at least one output stage transistor, a circuit for compensating for quiescent current drifts and optionally components for driving the output stage transistor. The circuit for compensating for quiescent current drifts has at least one reference current field-effect transistor with a gate electrode where the gate electrode is disposed in a region of the electrodes of the output stage transistor. Additionally, the reference current field-effect transistor is situated on a common chip area with the output stage transistor. Furthermore, the use of the above amplifier circuit in mobile radio systems is described.

9 Claims, 2 Drawing Sheets

ACTIVE OPERATING POINT ADJUSTMENT FOR POWER AMPLIFIERS

CROSS-REFERENCE TO RELATED APPLICATION

This is a continuation of copending International Application PCT/DE99/01679, filed Jun. 8, 1999, which designated the United States.

BACKGROUND OF THE INVENTION

Field of the Invention

The invention relates to an amplifier circuit containing at least one output stage transistor, a circuit for compensating for quiescent current drifts and optionally components for driving the output stage transistor(s).

Amplifier circuits for radiofrequency technology generally contain output stage transistors, such as e.g. GaAs-MESFETs. By way of example, the operating point of the output stage of a mobile telephone is adjusted to a region of the gain characteristic which lies in the lower third of the drain-source current $I_{DS}$, typically at approximately $I_{DS} = 0.1 \times I_{DSS}$ (class AB operation).

Suitable amplifier circuits with high efficiency generally contain, on one chip, a plurality of MESFETs having a multiplicity of elongate doping regions. During fabrication, slight production-dictated fluctuations (e.g. due to varying doping concentration) may occur from chip to chip or from wafer to wafer, the fluctuations resulting in gain characteristics that are not exactly reproducible. Therefore, it is necessary to subsequently adjust the quiescent current for each individual chip. This is done by adjusting the so-called "pinch-off" voltage $v_p$ in a range of from e.g. $-4$ V to $-2.5$ V, with the result that $I_{DS}$ lies within a predetermined range of e.g. $I_{DS} = 10\% \ I_{DSS} \pm 10\%$. An additional difficulty resides in the fact that the limit value for the quiescent current must be adhered to in the entire temperature range of from $-30°$ C. to $80°$ C., for example. Complicated optimization of the quiescent current by subsequent calibration of the finished circuit is therefore customary. However, corresponding calibration is cost-intensive and complicated.

Active operating point adjustment for power amplifiers is likewise disclosed in Published, British Patent Application GB 2 307 155 A, Published, European Patent Application 0 529 421 A, an article by M. T. Schmidl et al., titled "Low Overhead, Low Complexity Burst Synchronization for OFDM", 1996 IEEE, Bd. 3, Pgs. 1301–1306, and an article by B. Stantchev et al., titled "Burst Synchronization for OFDM-Bade Cellular Systems With Separate Signaling Channel", VTC '98. 48th IEEE, Pgs 758–762, vol. 2.

SUMMARY OF THE INVENTION

It is accordingly an object of the invention to provide an active operating point adjustment for power amplifiers which overcomes the above-mentioned disadvantages of the prior art devices of this general type, which does not have to be subsequently calibrated and has a quiescent current lying within the predetermined limits over a significantly extended temperature range.

With the foregoing and other objects in view there is provided, in accordance with the invention, an amplifier circuit, including a common chip area; at least one output stage transistor having electrodes and disposed on the common chip area; and a circuit for compensating for quiescent current drifts having at least one reference current field-effect transistor with a gate electrode, the gate electrode is disposed in a region of the electrodes of the output stage transistor and at a distance of less than 100 μm from a nearest one of the electrodes of the output stage transistor.

The reference current transistor according to the present invention is configured in such a way that it models as well as possible the external electrical and physical influences on the output stage transistors, which influences act on the quiescent current. The reference current transistor is preferably at the same electrical potential as the output stage transistor.

The amplifier circuit according to the invention preferably has a quiescent current that lies in a range of from 10 to 500 mA in the temperature range of from $-30°$ C. to $80°$ C.

The gate electrode is preferably situated at a distance of less than 100 μm from the nearest electrode of an output stage transistor(s). The gate electrode is particularly preferably disposed at a distance of less than 50 μm.

A transistor that preferably corresponds to the greatest possible extent to the configuration of the output stage transistor is used as the reference current transistor. In particular both kinds of transistors are fabricated using GaAs-MESFET technology. It is particularly expedient, during the fabrication of the circuit, to concomitantly use a partial region of the doping regions of the output stage transistor for the reference current transistor. In other words, one or more doping regions which are provided for the output stage transistors is or are used for forming a reference current transistor.

The current of the reference current transistor is preferably used for regulating the input signal of the output stage transistor(s).

In a preferred embodiment, the circuit for compensating for quiescent current drifts is not disposed on the chip on which the output stage transistors are situated.

Preferably, the circuit for compensating for quiescent current drifts, with the assistance of a largely constant reference voltage and a resistor, forms a voltage that is proportional to the current of the reference current transistor(s). This voltage is then used for regulating the input signal of the output stage transistor(s).

For regulating the input signal of the output stage transistor(s), the circuit for compensating for quiescent current drifts preferably has at least one transistor. This transistor is particularly preferably a bipolar transistor, in particular a PNP transistor using bipolar technology.

Furthermore, the circuit for compensating for quiescent current drifts expediently has an additional circuit configuration, which compensates for temperature drifts of the compensation circuit which are additionally present.

The present invention further relates to the use of the amplifier circuit according to the invention as a power amplifier in mobile radio systems, such as mobile telephones for example.

Other features which are considered as characteristic for the invention are set forth in the appended claims.

Although the invention is illustrated and described herein as embodied in an active operating point adjustment for power amplifiers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 3:
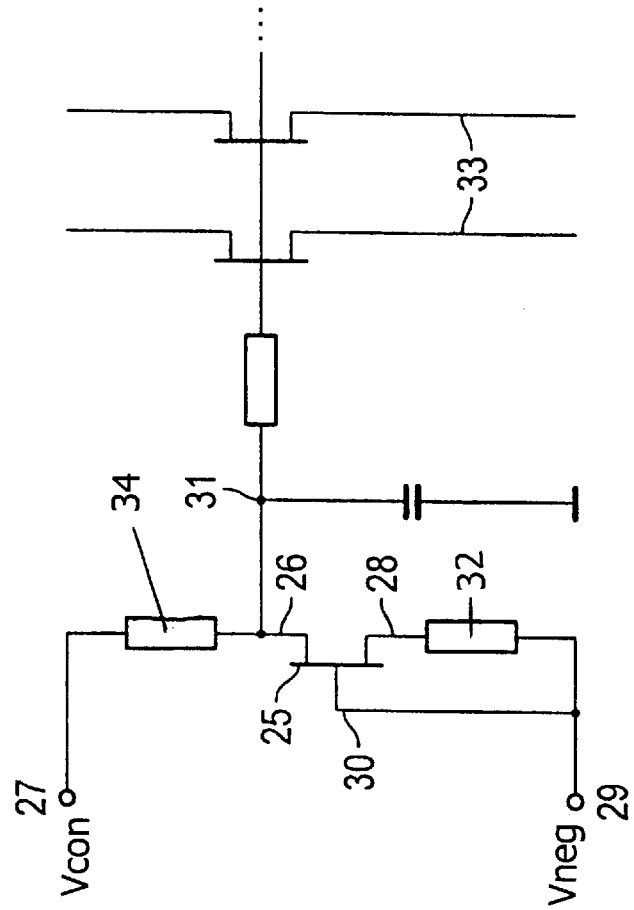
FIG. 3 is a circuit configuration for adapting a quiescent current based on a constant-current source according to the prior art.

In all the figures of the drawing, sub-features and integral parts that correspond to one another bear the same reference symbol in each case. Referring now to the figures of the drawing in detail and first, particularly, to FIG. 3 thereof, there is shown a circuit that is known from the prior art and effects partial stabilization of the quiescent current. A component in which this circuit configuration is used is marketed by Siemens AG under the designation CGY-96. In the circuit, a field-effect transistor 25, a resistor 32 and a $V_{neg}$ 29 form a constant-current source. A drain terminal 26 of the field-effect transistor 25 is connected via a resistor 34 to a positive voltage $V_{con}$ 27. From a gate 30 of the field-effect transistor 25 there is likewise a connection to $V_{neg}$ 29. This circuit configuration is connected via terminal 31 to gates of output stage field-effect transistors 33 of an amplifier circuit. All of the components that form the circuit in FIG. 3 are situated on a chip fabricated using MMIC technology. The regulating circuit for controlling a quiescent current is disposed in a separate circuit section at a distance of much more than 500 μm from the output stage transistors 33. This configuration has the disadvantage that the customer has to perform calibration of the amplifier circuit at the point 27 ($V_{con}$). Furthermore, the fact that a drain current has a nonlinear dependence on the voltage $V_{con}$ 27 is disadvantageous.

Figure 1:
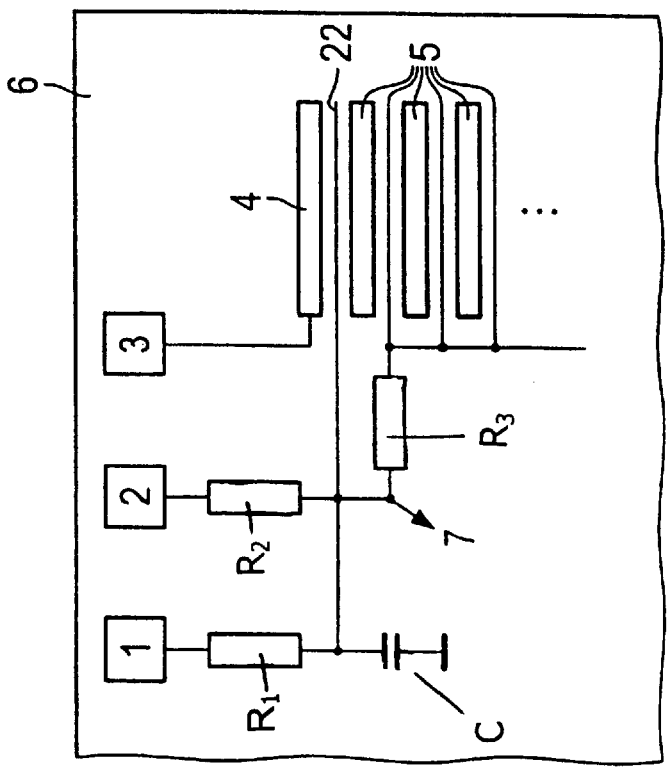
FIG. 1 a diagrammatic, fragmented, plan view of an example of a circuit configuration on a chip according to the invention.

In FIG. 1, there is shown a radio frequency section of an amplifier circuit according to the invention. Finger-shaped doping regions of output stage transistors 5 are situated on a chip 6, which is preferably a chip formed using MMIC technology. The output stage transistors 5 are preferably HF-FETs, such as GaAs-MESFETs for example. Furthermore, bonding pads 1–3 for $V_{neg}$ 1, a gate 2 and a drain 3 are situated on the chip 6. $V_{neg}$ 1 is connected via a resistor R1 to a capacitor C and gate 22 of a reference current transistor. The bonding pad 2 is connected to the gate 22 of the reference current transistor via a further resistor R2. Furthermore, there is a connection to gates of the output stage transistors 5 via a resistor R3. The bonding pad 3 is connected to a drain finger 4 of the reference current transistor. There is a connection to further gates at circuit point 7. The reference current transistor is connected up with individual amplifier stages as a current mirror.

Figure 2:
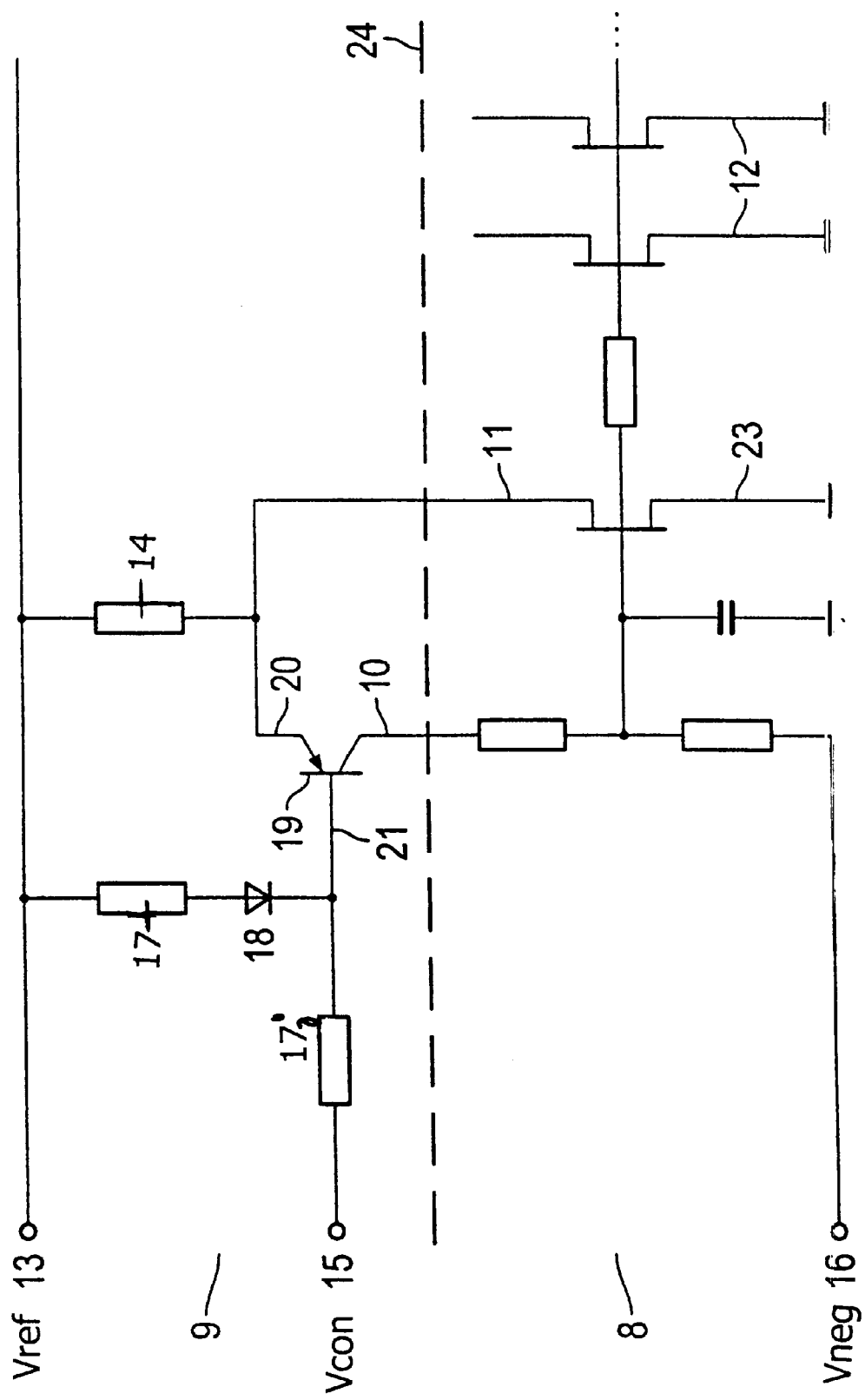
FIG. 2 is a circuit configuration with the circuit section shown in FIG. 1 on the chip and with a compensation circuit.

In the circuit as shown in FIG. 2, line 24 defines a spatial and circuitry separation of a region 8 (chip) with respect to a region 9 (external circuit region). Circuit point 10 corresponds to the terminal gate 2 in FIG. 1 and circuit point 11 corresponds to the terminal drain 3 in FIG. 1. At $V_{ref}$ 13, a voltage is present which is preferably stabilized and is approximately +3 V, for example. The fluctuations are expediently less than ±5%. The potential at point $V_{con}$ 15 lies in the range of from 0 to 2 V. A voltage of approximately −4 V is present at point $V_{neg}$ 16. A resistor $R_{ref}$ 14 is connected to an emitter 20 of a transistor 19 and to a reference current transistor 23 (drain).

A voltage of +1 V, for example, is present at the resistor $R_{ref}$ 14. The voltage at point 20 is then +2 V, and that at base 21 is +1.3 V.

By way of example, the transistor 19 is a PNP dual transistor 19 using bipolar technology that can be used as a component for regulation 19. Temperature compensation of the component for regulation 19 can preferably be performed with the aid of components 17 and 18. In this case, the $V_{ref}$ 13 is connected to a diode 18 via a resistor 17. From the diode 18 there are connections to the base 21 and, via a resistor 17', to $V_{con}$ 15. The compensation circuit according to the invention makes it possible to correct a constant quiescent current over a wide temperature range. The current physical conditions in the region of the output stage transistors 12 are modeled particularly exactly and without a time delay by virtue of the extensive spatial and geometrical correspondence of the reference current transistor 23 to the output stage transistors 12. The circuit also affords the advantage that the reference current transistor 23 is at the same electrical potential as the output stage transistors 12.

The amplifier circuit according to the invention is additionally advantageous by comparison with known amplifier circuits since there is optimum thermal coupling of the reference current transistor to the thermally active output stage transistors. Added to this is the fact that advantages are achieved as a result of this during dynamic operation.

Complicated calibration for adjusting the quiescent current into a limit value range that is prescribed in an equipment-specific manner can be dispensed with in the case of the amplifier circuit according to the invention. This results in an increase in the yield during wafer fabrication.

A further advantage of the amplifier circuit according to the invention is the reduction in the magnitude of the negative auxiliary voltage required.

Furthermore, simplified current setting is made possible by virtue of a linear dependence of $I_D$ with respect to the $V_{con}$.

The amplifier circuit according to the invention affords advantages particularly when on-chip resistances are used which are subjected to relatively high tolerances. However, corresponding on-chip resistances have practically no influence on the regulated variable in the amplifier circuit according to the invention.

In addition, during the production of the amplifier circuit according to the invention, it is possible to reduce the time required for production since selection of the exposure masks required during production can be omitted.

I claim:

1. An amplifier circuit, comprising:
   a common chip area;
   at least one output stage transistor having electrodes and disposed on said common chip area; and
   a circuit for compensating for quiescent current drifts having at least one reference current field-effect transistor with a gate electrode and an additional circuit configuration for compensating for temperature drifts of said circuit for compensating for quiescent current drifts, said gate electrode disposed in a region of said electrodes of said output stage transistor and at a distance of less than 100 μm from a nearest one of said electrodes of said output stage transistor.

2. The amplifier circuit according to claim 1, wherein a configuration of said reference current field-effect transistor corresponds to a greatest possible extent to a configuration of said output stage transistor.

3. The amplifier circuit according to claim 1, wherein said reference current field-effect transistor has a current used for regulating an input signal received by said output stage transistor.

4. The amplifier circuit according to claim 1, wherein said circuit for compensating for quiescent current drifts is not disposed on said common chip area on which said output stage transistor is situated.

5. The amplifier circuit according to claim 3, including a resistor receiving a constant voltage reference voltage, said circuit for compensating for quiescent current drifts with assistance from the constant reference voltage and said resistor forms a voltage which is proportional to the current of said reference current field-effect transistor and is used for regulating the input signal of said output stage transistor.

6. The amplifier circuit according to claim 1, wherein said circuit for compensating for quiescent current drifts has at least one transistor of bipolar technology for regulating an input signal received by said output stage transistor.

7. The amplifier circuit according to claim 1, wherein said circuit for compensating for quiescent current drifts is disposed on said common chip area on which said output stage transistor is situated.

8. The amplifier circuit according to claim 1, including components for driving said output stage transistor.

9. A mobile radio system, comprising:
    an amplifier circuit, including:
        a common chip area;
        at least one output stage transistor having electrodes and disposed on said common chip area; and
        a circuit for compensating for quiescent current drifts having at least one reference current field-effect transistor with a gate electrode and an additional circuit configuration for compensating for temperature drifts of said circuit for compensating for quiescent current drifts, said gate electrode disposed in a region of said electrodes of said output stage transistor and at a distance of less than 100 $\mu$m from a nearest one of said electrodes of said output stage transistor.

* * * * *